United States Patent [19]
Evans, Jr.

[11] Patent Number: 5,963,466
[45] Date of Patent: Oct. 5, 1999

[54] FERROELECTRIC MEMORY HAVING A COMMON PLATE ELECTRODE

[75] Inventor: Joseph T. Evans, Jr., Albuquerque, N.Mex.

[73] Assignee: Radiant Technologies, Inc., Albuquerque, N.Mex.

[21] Appl. No.: 09/059,606

[22] Filed: Apr. 13, 1998

[51] Int. Cl.$^6$ .............................. G11C 11/22; H01L 29/76
[52] U.S. Cl. .......................... 365/145; 257/295; 257/296
[58] Field of Search ............................ 365/145; 257/295, 257/296, 310, 311

[56] References Cited

U.S. PATENT DOCUMENTS

| | | | |
|---|---|---|---|
| 5,010,518 | 4/1991 | Toda | 365/145 |
| 5,300,799 | 4/1994 | Nakamura et al. | 257/295 |
| 5,716,875 | 2/1998 | Jones, Jr. et al. | 438/3 |

Primary Examiner—David Nelms
Assistant Examiner—Anh Phung
Attorney, Agent, or Firm—Calvin B. Ward

[57] ABSTRACT

A memory for storing a plurality of words of data. The memory is constructed from one or more storage blocks. Each storage block includes a plurality of storage words, each storage word storing one of the words of data. Each storage word includes a plurality of single bit storage cells. The single bit storage cells include a ferroelectric capacitor and a pass transistor having a gate, source, and drain. The ferroelectric capacitor includes a bottom electrode, a layer of ferroelectric material, and a top electrode, the layer of ferroelectric material being sandwiched between the top and bottom electrodes. One bit of data is stored in the direction of polarization of the ferroelectric material in contact with the bottom electrode. The bottom electrode is connected to the source of the pass transistor. The top electrode of each single bit storage cell is part of a continuous conducting layer covering all of the ferroelectric capacitors in the storage block. Similarly, the ferroelectric layer is part of a continuous layer of ferroelectric material that is shared by all of the ferroelectric capacitors in the storage block.

4 Claims, 5 Drawing Sheets

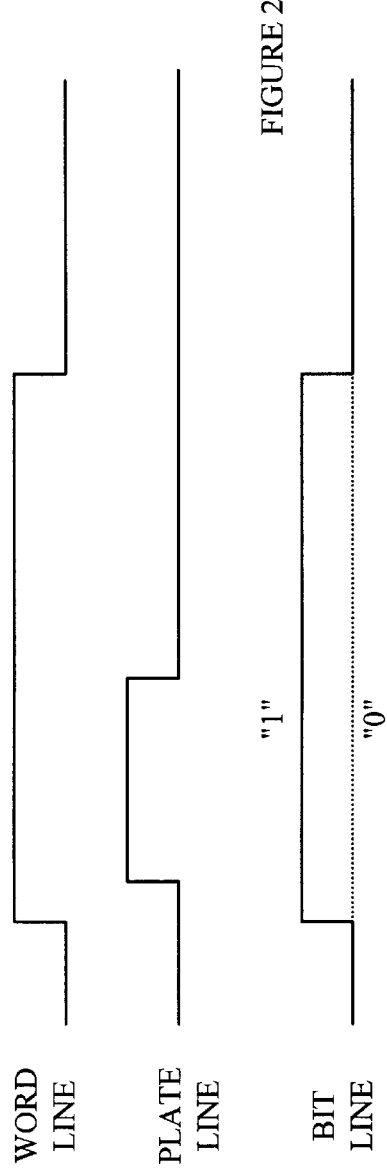
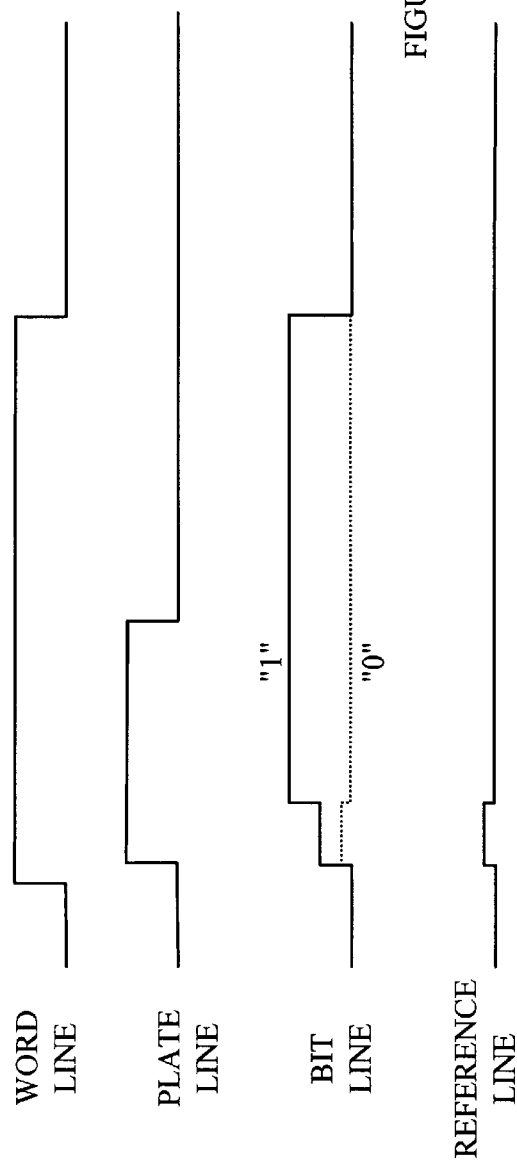

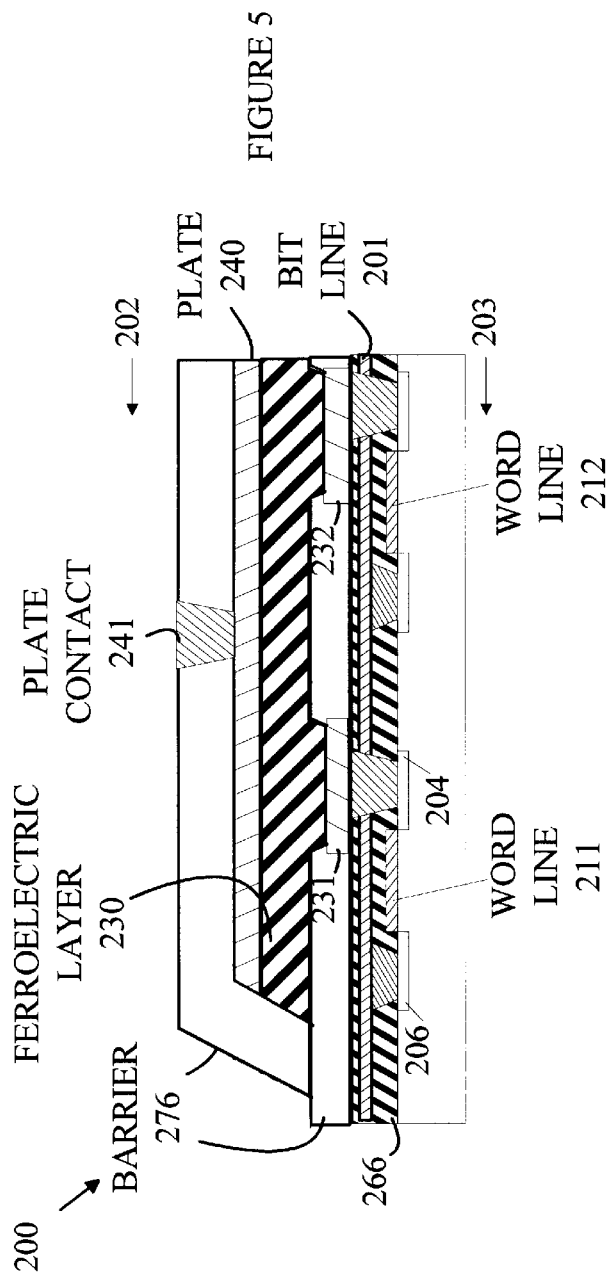
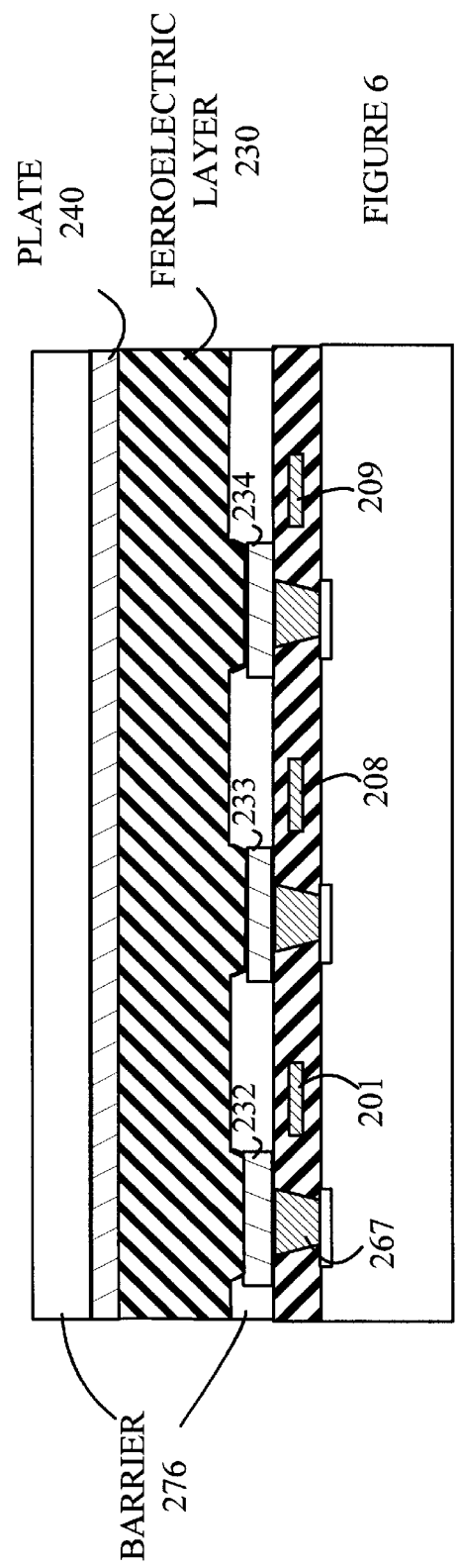

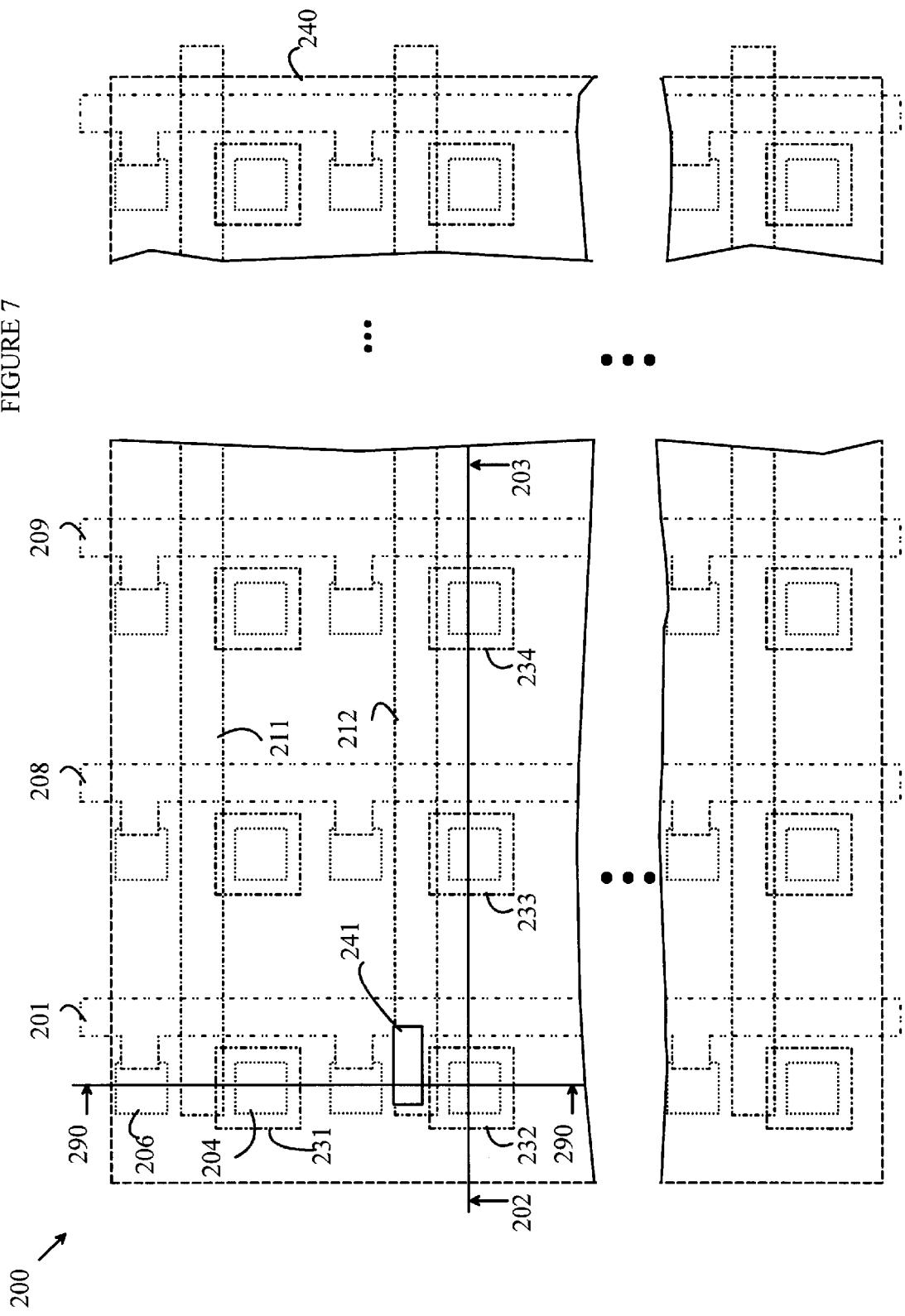

FERROELECTRIC MEMORY HAVING A COMMON PLATE ELECTRODE

FIELD OF THE INVENTION

The present invention relates to memory devices, and more particularly, to ferroelectric memories based on capacitors having ferroelectric dielectric layers.

BACKGROUND OF THE INVENTION

Computer memories may be conveniently classified in terms of whether or not the memory retains the information stored therein when power is removed from the memory. Conventional DRAMs and SRAMs are examples of memories that lose their contents when power is removed. EEPROM and flash RAM are examples of non-volatile memories. The cost of non-volatile memories per bit remains sufficiently high to discourage their use in many applications. In addition, the underlying memory structures may only be written a relatively small number of times compared to volatile memories. For example, an EEPROM memory cell can only be written approximately $10^4$ times. In addition, the time required to write data into an EEPROM is much longer than that required to write volatile memories. Hence, EEPROM cells have a relatively limited class of applications.

One class of non-volatile memory device stores information by altering the direction of polarization of a ferroelectric dielectric layer within the device. These devices are structurally similar to capacitors in which the dielectric layer is replaced by a ferroelectric material. In these devices, the ferroelectric dielectric may be polarized in one of two directions. The direction of polarization is used to store information, a "1" corresponding to one direction of polarization and a "0" corresponding to the other direction of polarization. The polarization of the dielectric is maintained when power is removed from the system, thus providing non-volatile operation.

The direction of the polarization may be sensed by applying a potential sufficient to switch the polarization across the capacitor. For the purposes of this discussion, assume that the applied potential difference is such that it would switch the dielectric to the polarization state corresponding to a "1". If the capacitor was polarized such that it stored a "1" prior to the application of the read potential, the polarization will not be altered by the read voltage. However, if the capacitor was polarized such that it stored a "0" prior to the application of the read potential, the polarization direction will switch. This switching will give rise to a current that flows from one plate of the capacitor to the other. A sense amplifier measures the current that flows in response to the read potential to determine the state of the capacitor. Once the capacitor has been read, the data must be rewritten in the capacitor if the read potential caused the state of the capacitor to switch.

To construct a memory based on such capacitors, each capacitor is connected to a pass transistor that isolates, or connects, the capacitor to a bit line via one plate of the capacitor. The other plate of the capacitor will be referred to as the "common plate" in the following discussion. In general, the one-bit memory cells consisting of a capacitor and its associated pass transistor are organized into words. All of the bits in a given word are typically read at the same time. For example, in one memory design, the pass gates for each pass transistor in the word are connected to a common word line and the common plates are connected to a "plate line" associated with the word. Various control signals are applied to the word and plate lines during the reading and writing of the memory.

In general, a ferroelectric memory is constructed by first fabricating the pass transistors and associated circuitry utilizing conventional CMOS fabrication processes. The surface of the wafer is then covered with a protective layer and the capacitor structures fabricated on top of the protective layer. The bottom plate of each capacitor is constructed over the source of its corresponding pass transistor. A stack consisting of the ferroelectric material and the top plate of the capacitor is then constructed over the bottom electrode. A protective layer is then deposited over the capacitors and metal run on top of the protective layer to provide the plate lines. The top plates are connected to the plate lines through vias in the protective layer.

The additional masks and deposition steps needed to construct the capacitors and make the connections to the plate lines increase the cost and lower the yield of devices. In addition, the area occupied by the plate lines increases the device area as compared to non-ferroelectric memories.

Broadly, it is the object of the present invention to provide an improved ferroelectric memory.

It is a further object of the present invention to provide a ferroelectric memory requiring fewer masks than prior art devices.

It is a still further object of the present invention to provide a ferroelectric memory that does not require separate plate lines.

These and other objects of the present invention will become apparent to those skilled in the art from the following detailed description of the invention and the accompanying drawings.

SUMMARY OF THE INVENTION

The present invention is a memory for storing a plurality of words of data. The memory is constructed from one or more storage blocks. Each storage block includes a plurality of storage words, each storage word storing one of the words of data. Each storage word includes a plurality of single bit storage cells. The single bit storage cells include a ferroelectric capacitor and a pass transistor having a gate, source and drain. The ferroelectric capacitor includes a bottom electrode, a layer of ferroelectric material, and a top electrode, the layer of ferroelectric material being sandwiched between the top and bottom electrodes. One bit of data is stored in the direction of polarization of the ferroelectric material in contact with the bottom electrode. The bottom electrode is connected to the source of the pass transistor. The top electrode of each single bit storage cell is part of a continuous conducting layer covering all of the ferroelectric capacitors in the storage block. Similarly, the ferroelectric layer is part of a continuous layer of ferroelectric material that is shared by all of the ferroelectric capacitors in the storage block.

BRIEF DESCRIPTION OF THE DRAWINGS

FIG. 2 illustrates the pulse shapes used to write the memory shown in FIG. 1.

FIG. 3 illustrates the pulse shapes used to read the memory shown in FIG. 1.

FIGS. 5–7 are schematic views of a memory that utilizes a single plate electrode.

DETAILED DESCRIPTION OF THE INVENTION

Figure 1:
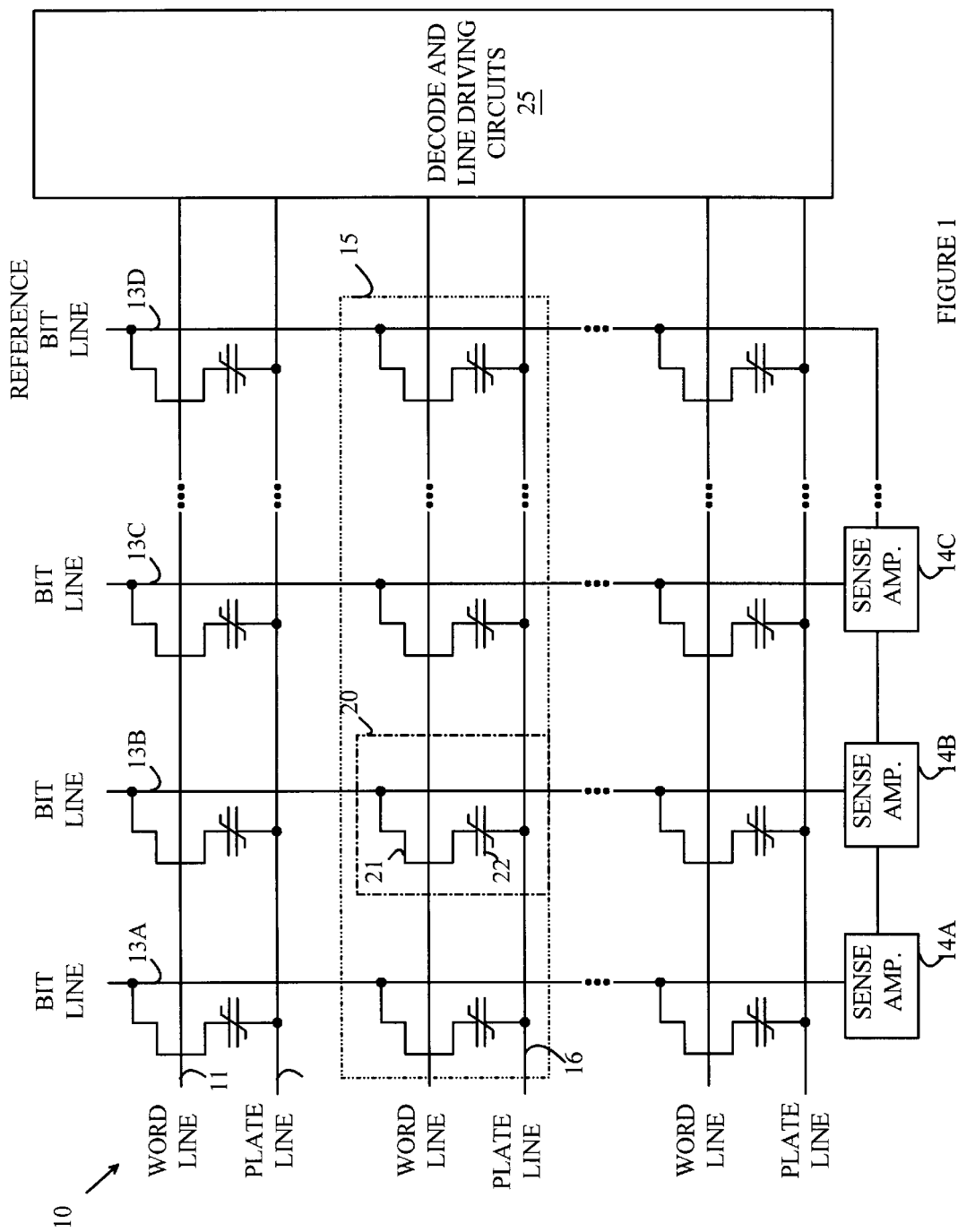
FIG. 1 is a schematic drawing of a portion of a memory according to the present invention.

The present invention may be more easily understood with reference to FIG. 1, which is a schematic drawing of a portion of a memory 10 according to the present invention. Memory 10 includes a plurality of words. A typical word is shown at 15. Denote the number of bits in each word by N. Then each word includes N+1 single bit memory cells of which memory cell 20 is typical. Each memory cell includes a pass transistor 21 and a capacitor 22 having a ferroelectric dielectric. The first N memory cells are used to store data. The remaining memory cell is a reference cell that always stores the same value.

The data stored in a word is determined by connecting the ferroelectric capacitors in that word to bit lines, there being one bit line per storage cell. The connection is made by turning on the pass transistors in that word by applying an appropriate signal to the word line running through that word utilizing drive circuit 25. An exemplary word line is shown at 11. Exemplary bit lines are shown at 13A–13D. The data stored in each of the N ferroelectric capacitors used to store data is determined by comparing the signal generated on the corresponding bit line with that generated by the reference cell on the reference bit line 13D. The comparison is performed by sense amplifiers connected to each bit line in the manner discussed below. Exemplary sense amplifiers are shown at 14A–14C.

The reference cell corrects for variations in the fabrication process and aging effects. Variations across the wafer in the thickness and composition of the various layers used to construct the capacitors can lead to variations in the charge stored on the capacitors. The reference cell always stores the same value and is physically close to the memory cells that store the data. Hence, the reference cell provides a calibration that allows the system to remove the effects of such variations. In addition, the reference cell is written each time the other bits of the word are written. Hence, the reference cell also compensates for aging effects.

The manner in which data is written into a memory cell in a word is shown in FIG. 2. The word line corresponding to the word is set high during the write cycle. This connects the capacitor in that word between the bit line associated with that capacitor and the plate line. The plate line is then pulsed for approximately half the write cycle while the data to be written into the capacitor is placed on the bit line. If the bit line is high, no potential difference will appear across the capacitor during the portion of the write cycle in which the plate line is also high; hence, the direction of polarization of the dielectric layer in the capacitor will remain unchanged. However, a potential difference will appear across the capacitor in the portion of the write cycle in which the plate line is low. This potential difference will result in the dielectric layer being polarized in the direction corresponding to a "1" being stored in the memory cell. If, on the other hand, the bit line is low, a potential difference in the opposite direction to that described above will appear across the capacitor during the portion of the write cycle in which the plate line is high. This results in the polarization of the dielectric in the capacitor being set to the direction corresponding to a "0". During the remaining portion of the write cycle, the capacitor will have no potential difference across it, and hence, the direction of polarization of the dielectric will remain as set in the first half of the cycle.

The manner in which data is read from a memory cell is shown in FIG. 3. The memory operates in a destructively read mode in which data is read from a memory cell and then re-written into the memory cell. A pulse on the appropriate word line defines the read cycle and connects the appropriate capacitor between the bit line and plate line. During the first half of the read cycle, the plate line is again pulsed high. Initially, the bit line is at ground and floating, and hence, the dielectric is forced to the polarization state corresponding to a "0". If the dielectric was already in this state, a small voltage will appear on the bit line. If the dielectric was in the opposite state, charge will be ejected onto the bit line when the state of polarization is flipped. This charge will raise the bit line potential to a value significantly above the small voltage discussed above. The sense amplifier compares the voltage on the bit line with that on the reference line to determine the data stored in the capacitor at the start of the cycle. The sense amplifier then latches the corresponding value onto the bit line. The reference line is latched at zero. The remainder of the read cycle is the same as that described above with respect to the write cycle. Hence, the data values latched onto the bit line and reference line will be rewritten back into the capacitors.

Figure 4:
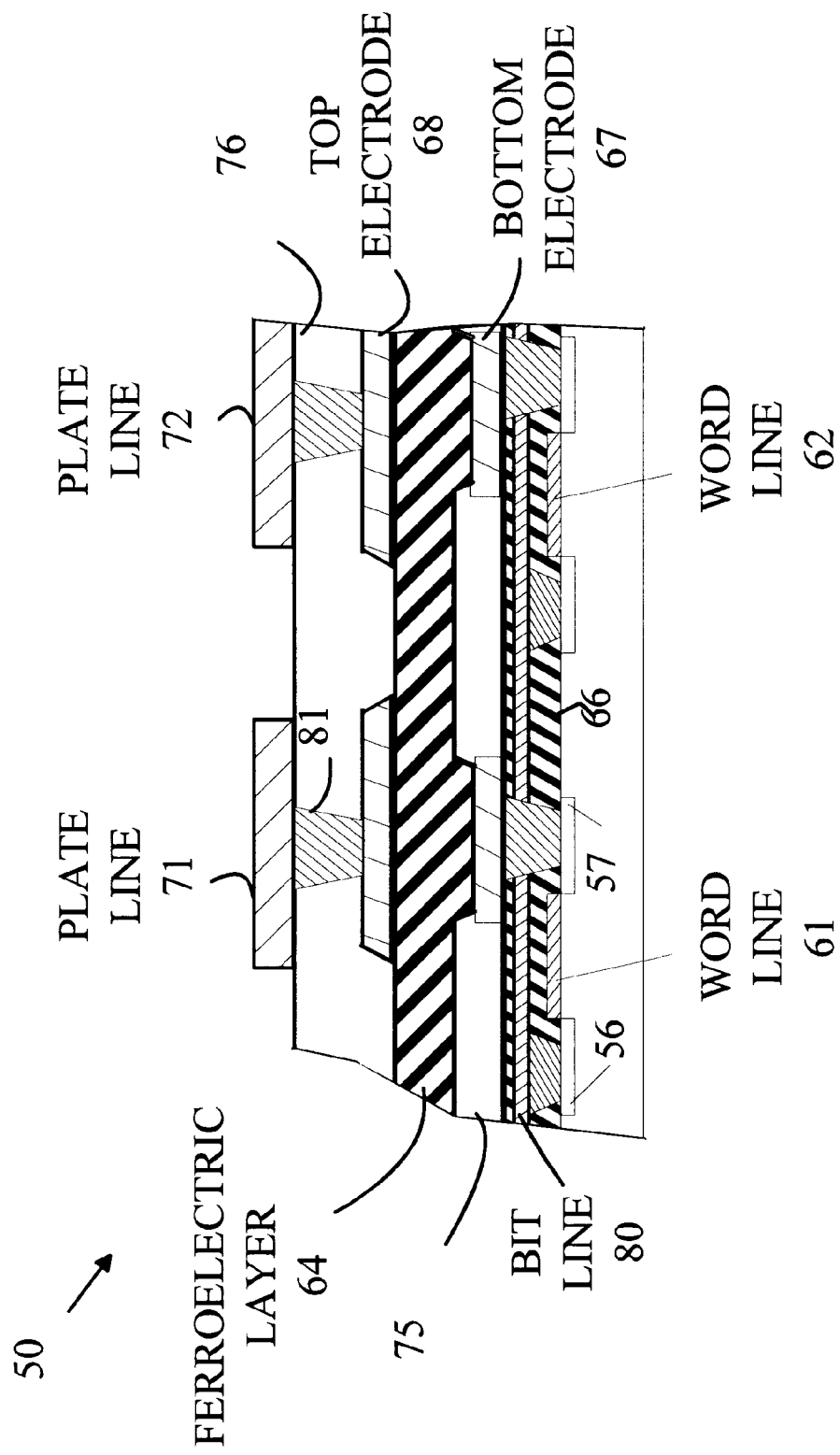
FIG. 4 is a cross-sectional view of a portion of a memory utilizing separate plate lines.

In high-density memories, the capacitors are constructed over the pass transistors and the plate lines are run over the top of the capacitors. Refer now to FIG. 4, which is a cross-sectional view of a portion of a high-density memory 50 having separate plate lines. The portion of the memory shown corresponds to two words controlled by word lines 61 and 62, that run perpendicular to the plane of the figure. The figure shows the bits that are connected to bit line 80, which runs perpendicular to word lines 61 and 62. The pass transistors, word lines, and bit lines are fabricated utilizing conventional CMOS processes. The gate and source of an exemplary pass transistor are shown at 56 and 57, respectively. The capacitors are typically fabricated over the CMOS circuitry, which is covered by an insulating layer 66. Each capacitor consists of a bottom electrode, a dielectric layer, and a top electrode. Exemplary bottom and top electrodes are shown at 67 and 68, respectively. A common ferroelectric dielectric layer 64 provides the dielectric for all of the capacitors. Oxygen impermeable barrier layers shown at 75 and 76 prevent oxygen from entering or leaving the ferroelectric layer which is typically constructed from a lead titanate material such as PZT (lead zirconium titanate) that has been doped with niobium or lanthanum.

The plate lines are typically run parallel to the word lines on top of barrier layer 76. Vias are etched through barrier layer 76 to provide connections to the plate lines. A typical via is shown at 81. The plate lines are typically constructed from aluminum to reduce the resistance of the lines. The capacitor electrodes are typically constructed from platinum for reasons of compatibility with the ferroelectric layer.

The structure shown in FIG. 4 has two drawbacks. First, the plate lines set the minimum size of the memory cells. The width of the plate lines, together with the interline spacing, determines one dimension of a one bit memory cell; accordingly, it would be advantageous to reduce the space occupied by the plate lines. Second, the connections from the plate lines to each of the top electrodes requires a number of steps requiring high tolerance. These steps decrease the device yield. Hence, it would be advantageous to reduce the number of steps and/or tolerances required in making the plate line connections.

The present invention is based on the observation that all of the plate lines can be combined into a single continuous layer which covers all of the single bit memory cells in the memory. Refer again to FIG. 1, and more particularly to single bit memory cell 20. If the word line in memory cell 20 is not selected, pass transistor 21 isolates ferroelectric capacitor 22 from bit line 13B. In an ideal circuit, a pulse applied to plate line 16 will not disturb the data stored on capacitor 22, as the potential generated by the pulse will appear across transistor 21 and not capacitor 22. In practice, there is a small parasitic capacitor connecting the source of pass transistor 21 to ground. Fortunately, this parasitic capacitance is much smaller than that of ferroelectric capacitor 22, which utilizes a high dielectric constant material such as PZT. Any potential applied to the plate line will be split between the parasitic capacitance and capacitor 22 according to the ratio of their respective capacitances. Hence, the resulting potential across capacitor 22 will still be too small to disturb the polarization of the dielectric sufficiently to change the data stored therein.

Refer now to FIGS. 5–7. FIG. 7 is a top view of a memory 200 according to the present invention. FIG. 5 is a cross-sectional view of memory 200 through line 290. FIG. 6 is a cross-sectional view through line 202–203. FIG. 5 shows a portion of the memory corresponding to two bits of two words controlled by word lines 211 and 212 and connected to bit line 201 which runs perpendicular to word lines 211 and 212. The bottom electrodes shown at 231 and 232 define the ferroelectric capacitors corresponding to these two bits. The bit lines corresponding to two additional bits of the word controlled by word line 212 are shown at 208 and 209 in FIG. 6. The bottom electrodes of the ferroelectric capacitors corresponding to these bits are shown at 233 and 234, respectively, in FIG. 6.

As described above, the pass transistor word lines, and bit lines are fabricated utilizing conventional CMOS processes. The drain and source of an exemplary pass transistor are shown at 206 and 204, respectively. The gate of this pass transistor is part of word line 211. The capacitors are fabricated over the CMOS circuitry after this circuitry has been covered by an insulating layer 266. Each capacitor has a separate bottom electrode. However, all of the capacitors in the memory share a common ferroelectric layer 230 and a common top electrode that forms the common plate 240.

It should be noted that the deposition of the bottom electrodes and the portion of the barrier layer 276 associated therewith is the only high tolerance fabrication step. Accordingly, the present invention provides a significant improvement in fabrication complexity, and hence, yield.

The bottom electrode may be a single metallic layer or a stack having a plurality of layers. Such electrode compositions are known to the art, and hence, will not be discussed in detail here. For the purposes of the present discussion, it is sufficient to note that electrodes constructed from a platinum layer and a layer of LSCO (lanthanum strontium cobalt oxide) in contact with the ferroelectric are preferred. The bottom electrode is connected to the source of the underlying pass transistor by a poly-silicon layer deposited in a via opened in insulating layer 266. An exemplary via is shown at 267 in FIG. 6.

The common top electrode that forms plate 240 is preferably constructed in a manner analogous to the bottom electrodes described above, i.e., a conducting layer consisting of an LSCO layer in contact with the ferroelectric material and a platinum layer in contact with the LSCO layer. A single plate contact 241 may be used to make electrical connection to the plate. Since the plate is a continuous two-dimensional layer, the problems associated with the resistivity of platinum are avoided because the extended cross-sectional area of the layer compensates for the higher resistivity of platinum. It should also be noted that the single contact point can be replaced by a plurality of contacts over the plate to assure that any one contact's failure will not prevent the device from operating.

The manner in which the connection to the common plate is made depends on the performance of the memory. If the thickness of the LSCO layer is sufficient to provide adequate conductivity, the platinum layer may be omitted, and the plate connection can be made directly to the LSCO layer. A plurality of contact points on the LSCO layer which are connected together by a grid of aluminum conductors may be utilized to reduce the resistance of the plate if the resistivity of the LSCO layer is too high. Alternatively, the platinum layer may be utilized over the LSCO as described above. Since platinum has one third the resistivity of LSCO, the platinum conductivity will determine the resistance of the plate. A similar grid of aluminum connections can be used with the platinum layer to further reduce the resistance of the plate. The choice of design is determined by the relative cost of the layers and the performance specification for the memory.

The ferroelectric layer is preferably constructed from a material that has a Curie point less than 400° C. but greater than the operating temperature of the device. Compositions based on PZT are preferred. The Curie point restriction allows the completed device to be annealed after fabrication is complete to a temperature above the Curie point of the ferroelectric material without damaging the aluminum conductors normally deposited to make the final connections in the device. This annealing step reduces defects generated in the ferroelectric layer by the various fabrication steps that were performed on the memory after the ferroelectric layer was deposited.

Ferroelectric layer 230 is surrounded by an oxygen barrier 276 to prevent oxygen from entering or leaving the ferroelectric layer. Barrier 276 is preferably constructed from $TiO_2$; however, any material that prevents oxygen from entering or leaving the ferroelectric may be utilized. For example, $Al_2O_3$ may also be utilized. This barrier operates in conjunction with the final annealing step described above. Without this barrier, the oxygen vacancy density in the ferroelectric material is altered during the various fabrication steps involving the heating of the ferroelectric layer after its original deposition.

The above-described embodiments of the present invention utilized a single plate for the entire memory. This configuration requires the minimum area. However, the capacitance of the plate may be too large to allow the plate to be pulsed with sufficient speed to operate in high-speed memories. In such situations, the common plate can be limited to blocks of contiguous words in the memory. For example, in memories that are organized as columns of words, each column can be provided with a common plate. The additional area needed to separate the columns adds little to the total area of the memory. Accordingly, this arrangement provides a plate with a smaller capacitance while providing most of the benefits of the single plate designs discussed above.

The above-described embodiments of the present invention utilized the word line to address the specific word being read or written. That is, all of the bits on a specific word line were written at once. Hence, the memory must be addressed down to the smallest increment that is to be written, which is usually a byte or the data in the bytes that are not addressed must be read and then re-written. In conventional memories, additional decoding circuitry must be included between the bytes if the memory is to be addressed to the byte level. This circuitry expands the size of the memory, and hence, it would be advantageous to avoid it. Similarly, it would be advantageous to provide a memory in which the bytes that were not being modified did not need to be re-written. In addition to increasing the circuitry complexity, such embodiments have lower lifetimes, since ferroelectric memories based on capacitor arrays have a lifetime that is measured in terms of the number of write cycles each bit is required to execute.

Embodiments of the present invention in which separate plates are used for each column of words provide a means for avoiding this circuitry. In such embodiments of the present invention, the word line extends to all bits of a word having a plurality of bytes. However, each column of bytes has a separate plate. The specific byte being written in a word is then selected by an addressing scheme in which the word is selected via the word line and the specific byte within the word is selected by choosing the common plate associated with that byte position. Since the decode circuitry for the common plate can be located at the end of the columns of bytes, no additional circuitry is needed within the array between the bytes.

Various modifications to the present invention will become apparent to those skilled in the art from the foregoing description and accompanying drawings. Accordingly, the present invention is to be limited solely by the scope of the following claims.

What is claimed is:

1. A memory for storing a plurality of words of data, said memory comprising:

a storage block comprising a plurality of storage words, each storage word storing one of said words of data, each storage word comprising a plurality of single bit storage cells, each single bit storage cell comprising:

a ferroelectric capacitor and a pass transistor having a gate, source and drain, said ferroelectric capacitor including a bottom electrode, a layer of ferroelectric material, and a top electrode, said layer of ferroelectric material being sandwiched between said top and bottom electrodes, one bit of data being stored in the direction of polarization of said ferroelectric material in contact with said bottom electrode, said bottom electrode being connected to said source of said pass transistor, wherein said top electrode of each single bit storage cell is part of a continuous conducting layer covering all of said ferroelectric capacitors in said storage block, and wherein said ferroelectric layer is part of a continuous layer of ferroelectric material; and a plate electrode contact for applying an electrical signal to said continuous conducting layer.

2. The memory of claim 1 further comprising:

a plate pulse circuit for generating and connecting said electrical signal to said plate electrode; and a word select circuit for receiving a word address and selecting one of said word storage words in response to said word address, said word select circuit applying an electrical signal to all of said gates in said pass transistors in that storage word.

3. The memory of claim 1 wherein said bottom electrode comprises a layer of platinum.

4. The memory of claim 1 wherein said ferroelectric layer comprises PZT.

* * * * *